(12) United States Patent
Yoshida et al.

(10) Patent No.: US 10,575,404 B2
(45) Date of Patent: Feb. 25, 2020

(54) ELECTRONIC COMPONENT

(71) Applicant: TDK CORPORATION, Tokyo (JP)

(72) Inventors: Naoyoshi Yoshida, Tokyo (JP); Kouki Yamada, Tokyo (JP); Hisashi Aiba, Tokyo (JP); Kazuto Takeya, Tokyo (JP); Hiroya Nakamura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/134,733

(22) Filed: Sep. 18, 2018

(65) Prior Publication Data

US 2019/0098761 A1 Mar. 28, 2019

(30) Foreign Application Priority Data

Sep. 28, 2017 (JP) ................. 2017-188313

(51) Int. Cl.
| | |
|---|---|
| H05K 1/18 | (2006.01) |
| H01G 4/005 | (2006.01) |
| H01G 2/06 | (2006.01) |
| H01G 4/30 | (2006.01) |
| H05K 1/02 | (2006.01) |
| H01G 4/12 | (2006.01) |

(52) U.S. Cl.
CPC ............. *H05K 1/181* (2013.01); *H01G 2/06* (2013.01); *H01G 4/005* (2013.01); *H01G 4/30* (2013.01); *H01G 4/12* (2013.01); *H05K 1/0201* (2013.01)

(58) Field of Classification Search
CPC ........ H01C 7/00–04; H01C 7/10; H01C 7/13; H01C 7/123; H01C 17/00; H05K 1/18; H05K 1/181–188; H01G 4/005

USPC ............. 338/20, 21, 22 SD, 22 R, 25, 226; 361/300–308

See application file for complete search history.

(56) References Cited

U.S. PATENT DOCUMENTS

| | | | | |
|---|---|---|---|---|
| 5,750,264 | A * | 5/1998 | Ueno ................... | C04B 35/47 428/426 |
| 6,232,867 | B1 * | 5/2001 | Yoshida ................ | H01C 7/102 29/610.1 |
| 6,535,105 | B2 * | 3/2003 | Heistand, II ......... | H01C 1/028 29/610.1 |
| 6,911,893 | B2 * | 6/2005 | Kodama ............... | C01G 23/002 257/E29.1 |
| 9,412,520 | B2 * | 8/2016 | Ahn ...................... | H01G 4/30 |
| 2003/0043012 | A1 * | 3/2003 | Shiraishi .............. | H01C 7/102 338/21 |

(Continued)

FOREIGN PATENT DOCUMENTS

| | | |
|---|---|---|
| JP | 2009-177085 A | 8/2009 |
| JP | 2010-080703 A | 4/2010 |

(Continued)

*Primary Examiner* — Tuan T Dinh
(74) *Attorney, Agent, or Firm* — Oliff PLC

(57) ABSTRACT

An electronic component includes an element body, a thin film layer disposed to cover a pair of end surfaces and four side surfaces, a first external electrode and a second external electrode, and internal conductors, wherein each of the first external electrode and the second external electrode has first electrode layers disposed on the thin film layer and electrically connected to the internal conductors, and second electrode layers disposed to cover the first electrode layers, and a thermal conductivity of the second electrode layers is lower than a thermal conductivity of the first electrode layers.

3 Claims, 5 Drawing Sheets

(56) References Cited

U.S. PATENT DOCUMENTS

| | | | | |
|---|---|---|---|---|
| 2008/0073108 A1* | 3/2008 | Saito | ................... | H01G 4/2325 |
| | | | | 174/256 |
| 2009/0191418 A1* | 7/2009 | Nakano | ............... | H01C 7/1006 |
| | | | | 428/469 |
| 2013/0088319 A1* | 4/2013 | Saito | ................... | H01C 1/1413 |
| | | | | 338/25 |
| 2013/0242457 A1* | 9/2013 | Lee | ....................... | H01G 4/008 |
| | | | | 361/301.4 |
| 2014/0167909 A1* | 6/2014 | Itami | ..................... | H01C 1/148 |
| | | | | 338/21 |
| 2014/0319974 A1 | 10/2014 | Feichtinger et al. | | |

FOREIGN PATENT DOCUMENTS

| | | |
|---|---|---|
| JP | 2015-506103 A | 2/2015 |
| WO | 2016/084457 A1 | 6/2016 |

* cited by examiner

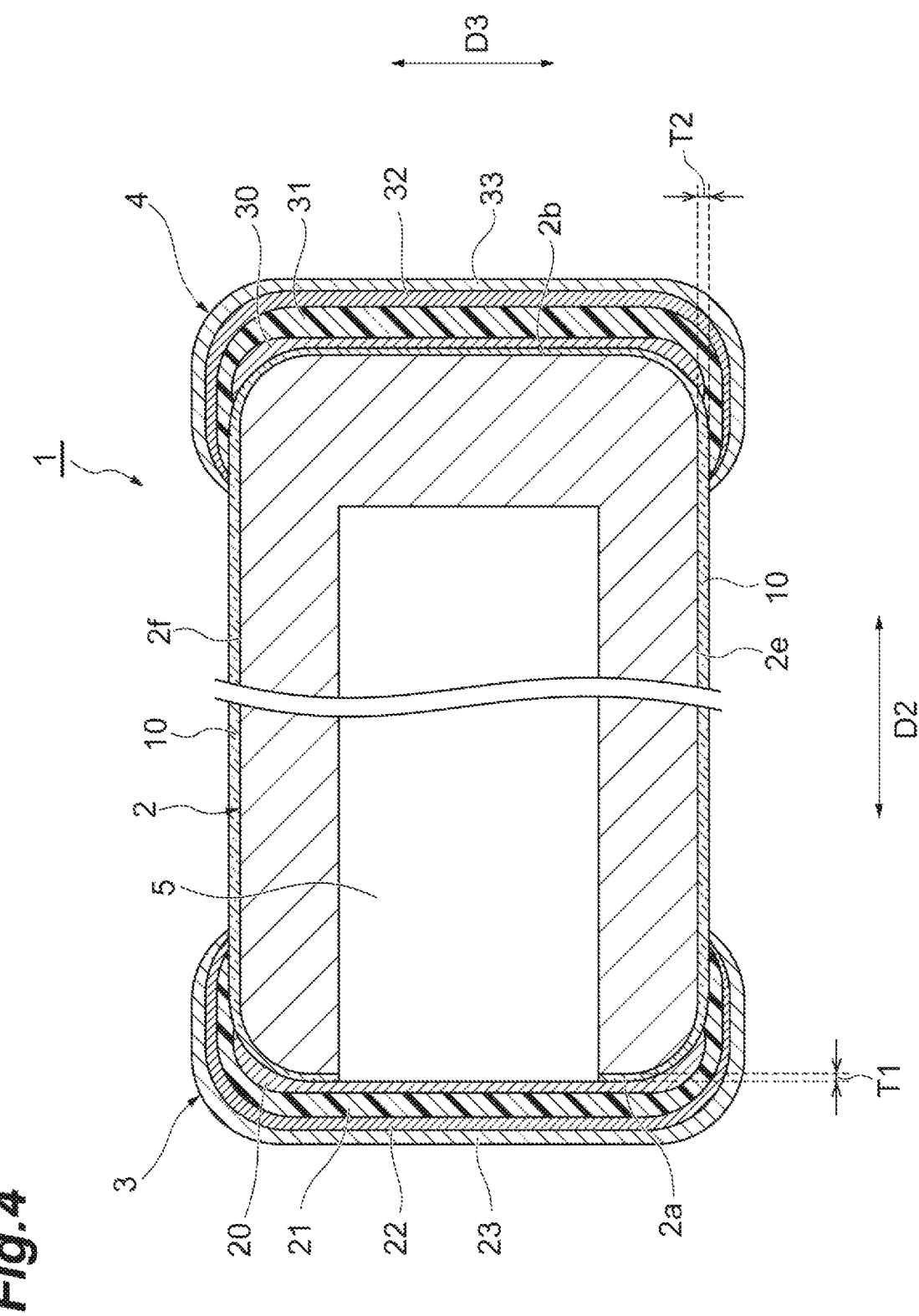

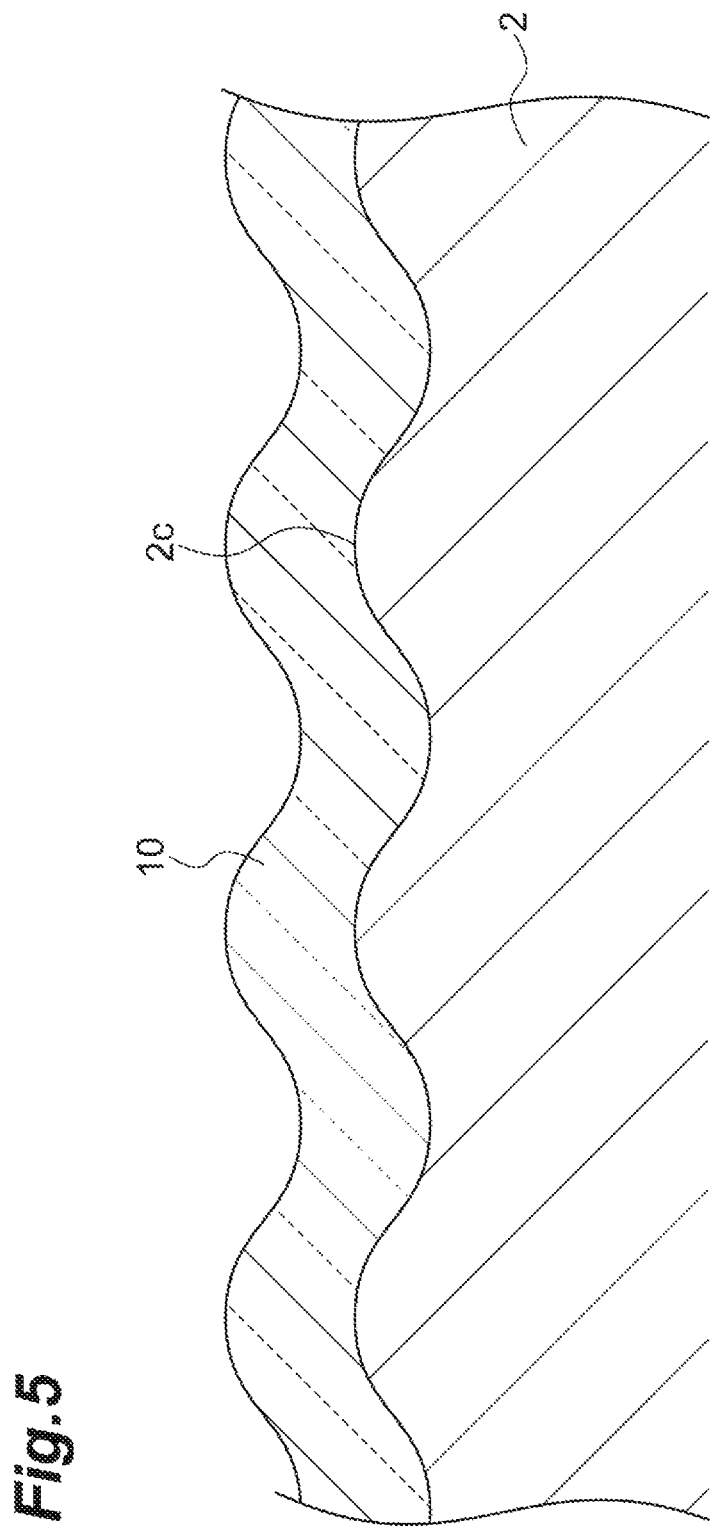

ELECTRONIC COMPONENT

TECHNICAL FIELD

An aspect of the present invention relates to an electronic component.

BACKGROUND

An electronic component including an element body having a pair of end surfaces facing each other and four side surfaces connecting the pair of end surfaces and formed of a ceramic, and a first external electrode and a second external electrode respectively disposed on the side of the pair of end surfaces of the element body is known (for example, refer to PCT International Publication No WO 2016/084457).

SUMMARY

When an electronic component is mounted on a circuit board or the like, heat (board heat, resistance heat) generated in the circuit board may be transferred to the element body via the external electrode. Characteristics of the electronic component may deteriorate when heat is transferred to the element body (functional part). Therefore, reliability of the electronic component may be lowered.

One aspect of the present invention is to provide an electronic component capable of curbing deterioration of reliability.

An electronic component according to one aspect of the present invention includes an element body having a pair of end surfaces which face each other and four side surfaces which connect the pair of end surfaces and formed of a semiconductor ceramic, a thin film layer disposed to cover the pair of end surfaces and the four side surfaces and having an electrical insulation property, a first external electrode and a second external electrode disposed on a side of each of the pair of end surfaces, and an internal conductor disposed in the element body, wherein the thin film layer is formed along a surface shape of each of the pair of end surfaces and the four side surfaces, each of the first external electrode and the second external electrode has a first electrode layer disposed on the thin film layer and electrically connected to the internal conductor, and a second electrode layer disposed to cover the first electrode layer, and a thermal conductivity of the second electrode layer is lower than a thermal conductivity of the first electrode layer.

In the electronic component according to one aspect of the present invention, the second electrode layer is disposed to cover the first electrode layer. The thermal conductivity of the second electrode layer is lower than the thermal conductivity of the first electrode layer. Therefore, when an electronic component is mounted on a circuit board or the like, transmission of heat generated in the circuit board or the like to the element body can be suppressed. The outer surface of the element body is covered with a thin film layer. Accordingly, in an electronic component, transfer of heat generated in a circuit board or the like to the element body can be suppressed. Therefore, deterioration in characteristics of electronic components due to heat generated in a circuit board or the like can be minimized. As a result, deterioration in reliability of electronic components can be minimized.

In the electronic component, the thin film layer is formed along the respective surface shapes of the pair of end surfaces and the four side faces. An outer surface of the element body may be concavo-convex. Therefore, a surface area of the thin film layer can increase and an anchoring effect can be obtained by forming the thin film layer along the surface shape of the outer surface of the element body. Therefore, adhesion between the thin film layer and the first electrode layer and the second electrode layer can be improved.

Therefore, in the electronic component, since bonding strength between the thin film layer and the first electrode layer and the second electrode layer can be secured, separation of the first electrode layer and the second electrode layer therefrom can be prevented. As a result, in the electronic component, it is possible to minimize deterioration in reliability.

In one embodiment, a thickness of the thin film layer disposed on the four side surfaces may be larger than a thickness of the thin film layer disposed on the pair of end surfaces. In this configuration, since the thickness of the thin film layer disposed on the four side surfaces is large, it is possible to prevent the heat from being transferred to the element body from the four side surfaces. Also, since the thickness of the thin film layer disposed on the end surface is relatively small (thin), an internal conductor drawn to the end surface is able to break through the thin film layer and be exposed from the thin film layer. Therefore, it is possible to ensure electrical connection between each of the first external electrode and the second external electrode and the internal conductor.

In one embodiment, the thin film layer may have a thickness of 50 nm or more and 300 nm or less.

According to one aspect of the present invention, it is possible to curb deterioration of reliability.

BRIEF DESCRIPTION OF THE DRAWINGS

FIG. 4 is a diagram showing the cross-sectional configuration of the electronic component.

FIG. 5 is an enlarged cross-sectional view showing a surface of the element body and a thin film layer.

DETAILED DESCRIPTION

Figure 1:
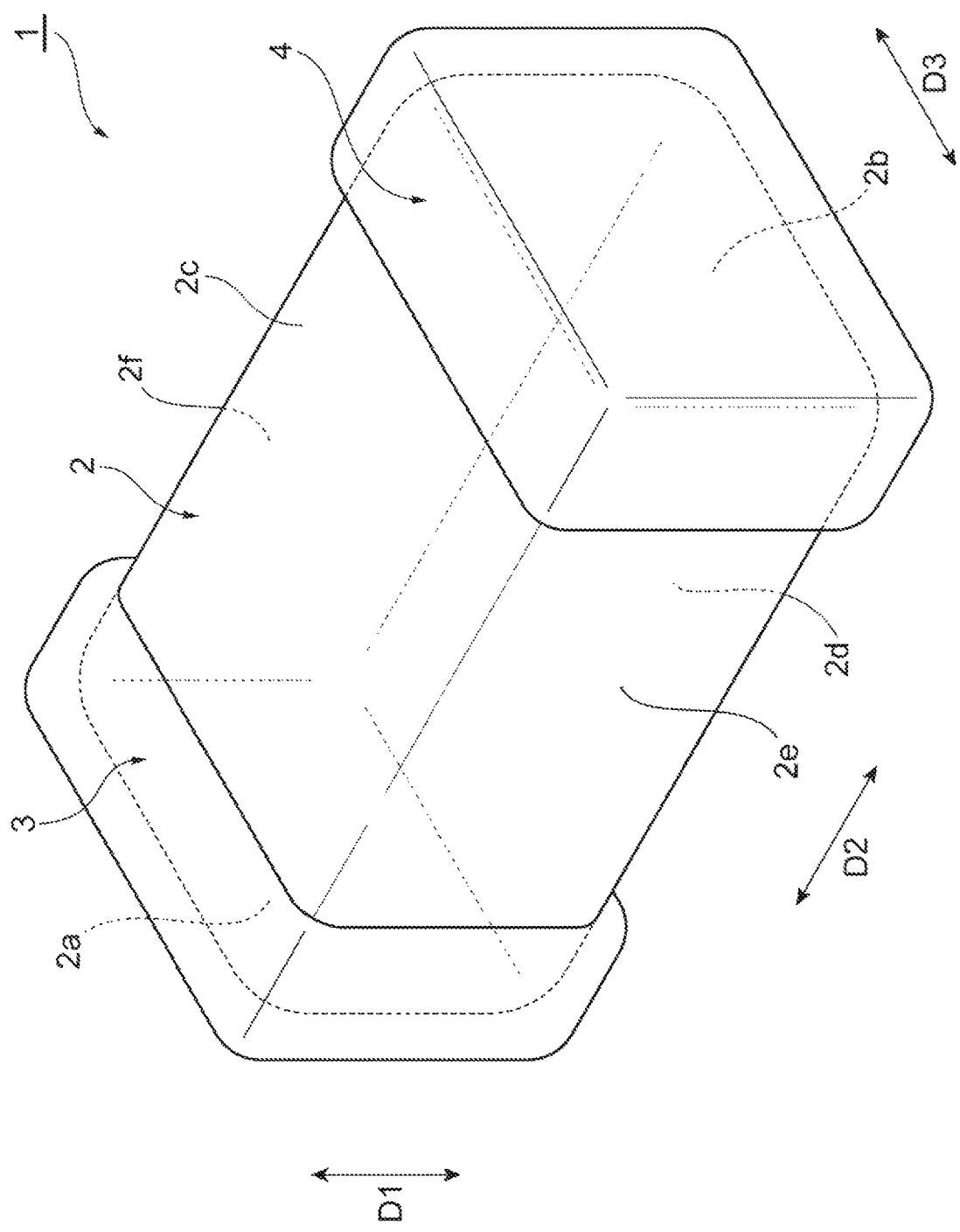
FIG. 1 is a perspective view showing an electronic component according to one embodiment.

Hereinafter, preferable embodiments of the present invention will be described in detail with reference to the accompanying drawings. In the drawings, the same or similar elements are designated by the same reference numerals, and repeated description will be omitted.

As shown in FIG. 1, an NTC thermistor (electronic component) 1 includes an element body 2, and a first external electrode 3 and a second external electrode 4 disposed on an outer surface of the element body 2.

The element body 2 has a rectangular parallelepiped shape. The rectangular parallelepiped shape includes a rectangular parallelepiped shape in which a corner portion and a ridge portion are chamfered, and a rectangular parallelepiped shape in which a corner portion and a ridge portion are rounded. The element body 2 includes a pair of end surfaces $2a$ and $2b$ facing each other, a pair of main surfaces (side surfaces) $2c$ and $2d$ facing each other, and a pair of side surfaces $2e$ and $2f$ facing each other, as outer surfaces thereof. A facing direction in which the pair of main surfaces $2c$ and $2d$ face each other is a first direction D1. A facing direction in which the pair of end surfaces 2a and 2b face each other is a second direction D2. A facing direction in which the pair of side surfaces 2e and 2f face each other is a third direction D3. In the embodiment, the first direction D1 is a height direction of the element body 2. The second direction D2 is a longitudinal direction of the element body 2 and is orthogonal to the first direction D1. The third direction D3 is a width direction of the element body 2 and is orthogonal to the first direction D1 and the second direction D2.

The pair of end surfaces 2a and 2b extend in the first direction D1 and perform connection between the pair of main surfaces 2c and 2d. The pair of end surfaces 2a and 2b also extends in the third direction D 3 (a short side direction of the pair of main surfaces 2c and 2d). The pair of side surfaces 2e and 2f extend in the first direction D1 to connect a space between the pair of main surfaces 2c and 2d. The pair of side surfaces 2e and 2f also extends in the second direction D2 (a long side direction of the pair of end surfaces 2a and 2b). In the embodiment, any one of the pair of main surfaces 2c and 2d is defined as a mounting surface facing another electronic device when the NTC thermistor 1 is mounted on another electronic device (for example, a circuit board, an electronic component or the like).

Figure 2:
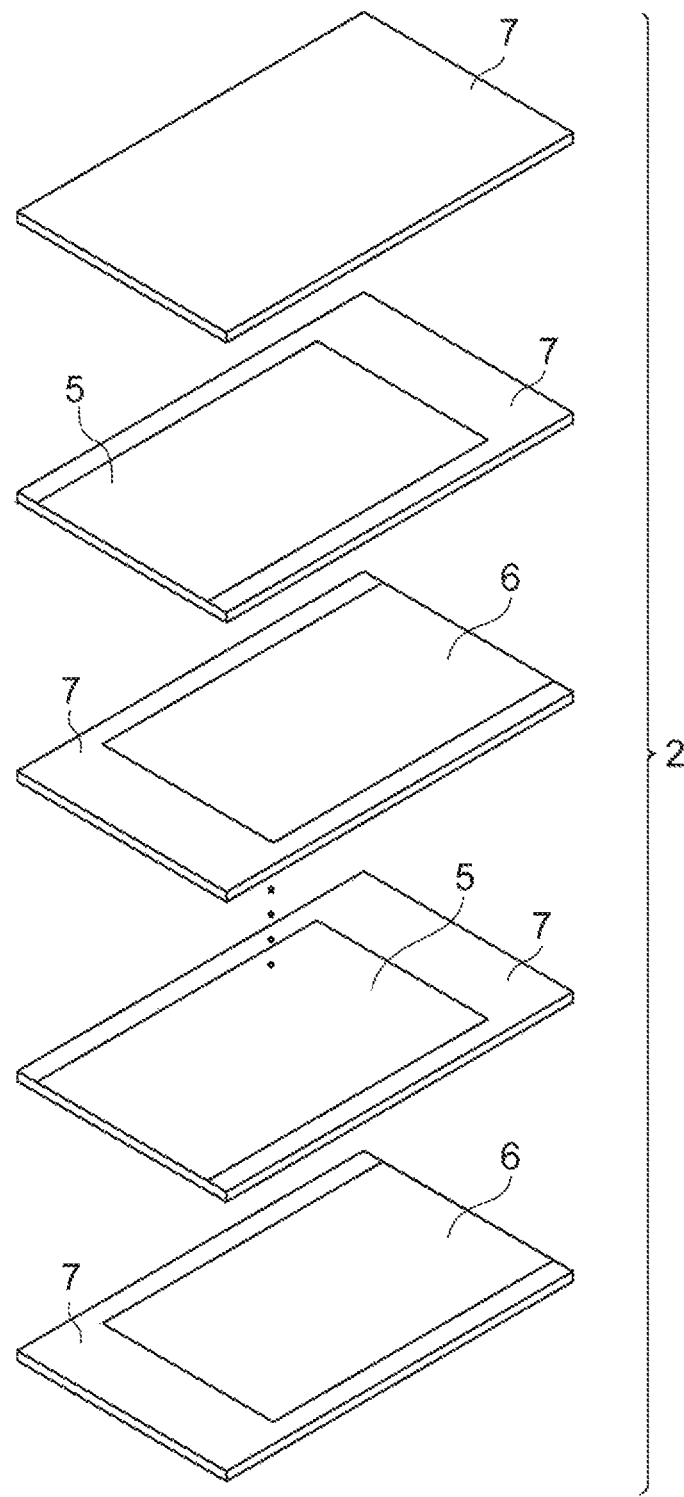
FIG. 2 is an exploded perspective view of an element body.

As shown in FIG. 2, the element body 2 is formed by stacking a plurality of thermistor layers 7 in a direction in which the pair of main surfaces 2c and 2d face each other. In the element body 2, a stacking direction of the plurality of thermistor layers 7 coincides with the first direction D1. Each of the thermistor layers 7 may be made of, for example, a semiconductor ceramic containing Mn, Ni and Co metal oxides as main components. The thermistor layers 7 may contain Fe, Cu, Al, Zr or the like as auxiliary components for allowing properties thereof to be adjusted (such as rate of change in resistance) in addition to each of Mn, Ni and Co metal oxides as main components. The thermistor layers 7 may be formed of Mn and Ni metal oxides or Mn and Co metal oxides instead of each of Mn, Ni and Co metal oxides. In the actual element body 2, each of the thermistor layers 7 is integrated to such an extent that a boundary between the thermistor layers 7 cannot be visually recognized.

A thin film layer 10 is disposed on an outer surface of the element body 2. The thin film layer 10 is disposed on the pair of end surfaces 2a and 2b, the pair of main surfaces 2c and 2d, and the pair of side surfaces 2e and 2f. That is, the thin film layer 10 is disposed to cover the entire outer surface of the element body 2. The thin film layer 10 is a glass layer having an electrical insulation property. Specifically, the thin film layer 10 is an amorphous glass coating layer. The thin film layer 10 is formed of a glass material such as silica glass and may include Al and Li. Crystallized glass is not used as the material of the thin film layer 10.

Figure 3:
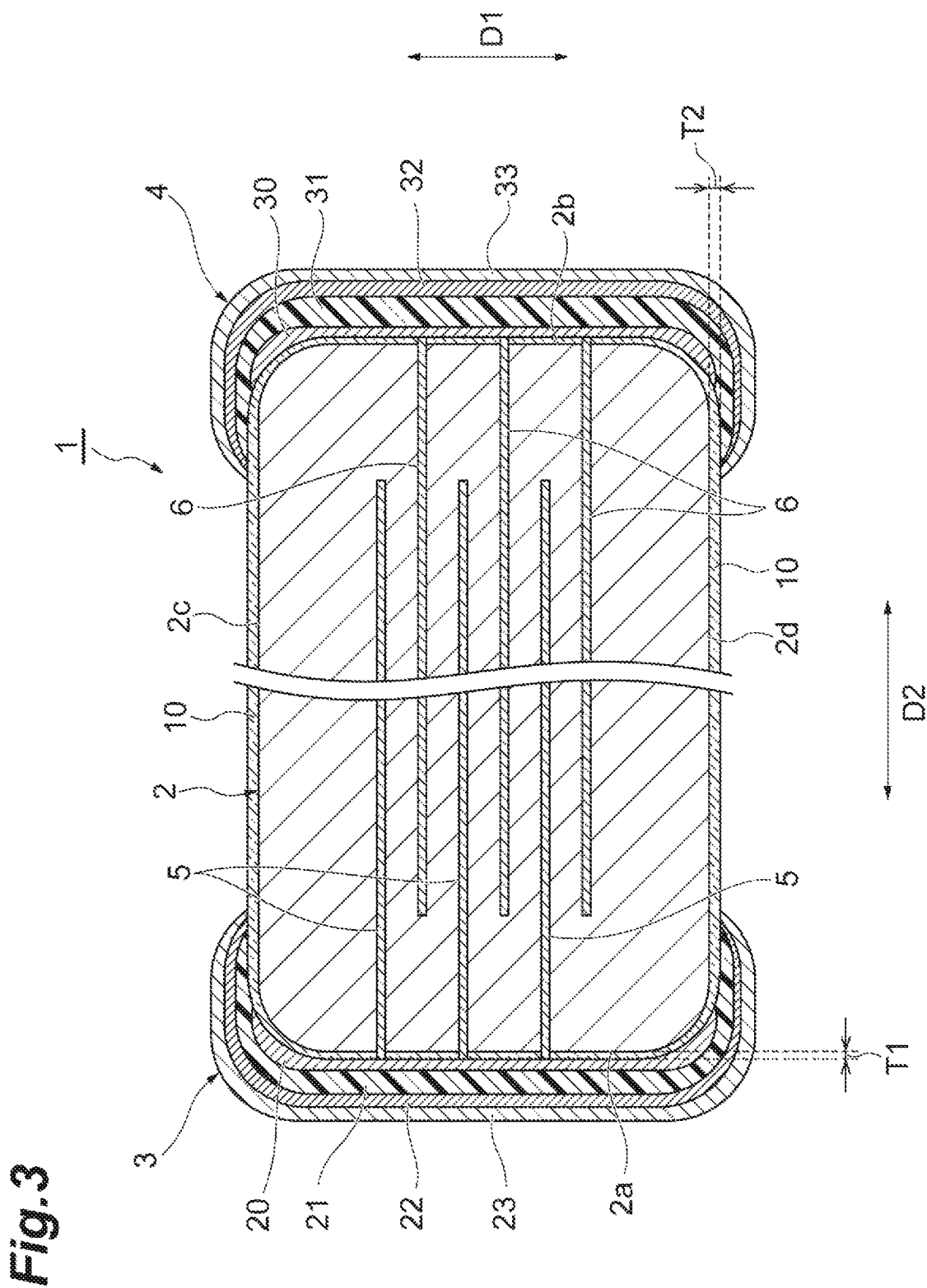
FIG. 3 is a diagram showing a cross-sectional configuration of the electronic component.

A thickness of the thin film layer 10 is 50 nm or more and 300 nm or less. As shown in FIGS. 3 and 4, a thickness T1 of the thin film layer 10 disposed on the pair of end surfaces 2a and 2b is smaller than a thickness T2 of the thin film layer 10 disposed on the pair of main surfaces 2c and 2d and the pair of side surfaces 2e and 2f (T1<T2). In other words, the thickness T2 of the thin film layer 10 disposed on the pair of main surfaces 2c and 2d and the pair of side surfaces 2e and 2f is larger than the thickness T1 of the thin film layer 10 disposed on the pair of end surfaces 2a and 2b. The thickness T1 is, for example, 50 nm. The thickness T2 is, for example, 80 nm.

The thin film layer 10 is formed along each surface shape of the pair of end surfaces 2a and 2b, the pair of main surfaces 2c and 2d, and the pair of side surfaces 2e and 2f of the element body 2. The thin film layer 10 reflects the surface shapes of the pair of end surfaces 2a and 2b, the pair of main surfaces 2c and 2d and the pair of side surfaces 2e and 2f of the element body 2. That is, in a cross section shown in FIG. 5, a surface shape of the thin film layer 10 is the same as the surface shape of each of the pair of end surfaces 2a and 2b, the pair of main surfaces 2c and 2d, and the pair of side surfaces 2e and 2f of the element body 2.

As shown in FIG. 5, for example, when the surface shape of the main surface 2c has a concavo-convex shape, the thin film layer 10 is formed along irregularities of the main surface 2c (or by reflecting the irregularities). In other words, the thin film layer 10 is formed on the main surface 2c to have substantially a uniform thickness with respect to the main surface 2c. The thin film layer 10 is formed by, for example, a sputtering method. The thin film layer 10 may be formed by CVD, PVD or the like.

As shown in FIG. 2, the NTC thermistor 1 includes a plurality of first internal electrodes 5 and a plurality of second internal electrodes 6 as internal conductors disposed inside the element body 2. In the embodiment, the number (three in the embodiment) of the plurality of first internal electrodes 5 is the same as the number of the plurality of second internal electrodes 6. Each of the plurality of first internal electrodes 5 is exposed on the end surface 2a. Each of the plurality of second internal electrodes 6 is exposed on the end surface 2b.

The first internal electrode 5 and the second internal electrode 6 are disposed at different positions (layers) in the first direction D1 of the element body 2. The first internal electrode 5 and the second internal electrode 6 are alternately disposed in the element body 2 to face each other with an interval therebetween in the first direction D1.

As shown in FIG. 1, the first external electrode 3 is disposed on the side of one end surface 2a. The first external electrode 3 is formed on five surfaces of one end surface 2a, the pair of main surfaces 2c and 2d, and the pair of side surfaces 2e and 2f. The first internal electrode 5 is directly connected to the first external electrode 3.

The first external electrode 3 includes a first electrode layer 20, a second electrode layer 21, a first plating layer 22, and a second plating layer 23.

The first electrode layer 20 is disposed on the thin film layer 10. The first electrode layer 20 is disposed on one end surface 2a of the element body 2. The first electrode layer 20 may be disposed at edge portions of the pair of main surfaces 2c and 2d and the pair of side surfaces 2e and 2f on the side of the end surface 2a. The first electrode layer 20 is disposed to cover the first internal electrode 5 exposed on the end surface 2a (exposed from the thin film layer 10).

The first electrode layer 20 is formed by applying a conductive paste to the surface of the element body 2 (one end surface 2a in the embodiment) and baking the conductive paste. The first electrode layer 20 is a sintered metal layer formed by sintering a metal component (metal powder) contained in the conductive paste. In the embodiment, the first electrode layer 20 is a sintered metal layer formed of Ag. The first electrode layer 20 may be a sintered metal layer formed of Pd. A powder composed of Ag or Pd mixed with a glass component, an organic binder, and an organic solvent is used as the conductive paste.

The first electrode layer 20 is electrically connected to the first internal electrode 5. When the first electrode layer 20 is formed by baking the conductive paste, the first internal electrode 5 exposed on the end surface 2a breaks through the thin film layer 10. At this time, the conductive paste is sintered while the first internal electrode 5 exposed from the thin film layer 10 and the conductive paste are in contact with each other. Accordingly, the first electrode layer 20 is electrically connected to the first internal electrode 5.

The second electrode layer 21 is disposed to cover the first electrode layer 20. The second electrode layer 21 is formed on five surfaces of one end surface 2a, the pair of main surfaces 2c and 2d, and the pair of side surfaces 2e and 2f. That is, an edge of the second electrode layer 21 is disposed on the thin film layer 10.

The second electrode layer 21 is a conductive resin layer. A thermosetting resin mixed with a conductive material and an organic solvent or the like is used as the conductive resin. For example, a metal powder is used as the conductive material. For example, Ag powder is used as the metal powder. For example, a phenol resin, an acrylic resin, a silicone resin, an epoxy resin, or a polyimide resin is used as the thermosetting resin. In the second electrode layer 21, a thickness of a central portion in the first direction D1 of the element body 2 may be larger than a thickness on the side of the pair of main surfaces 2c and 2d and a thickness on the side of the pair of side surfaces 2e and 2f.

A thermal conductivity of the second electrode layer 21 is lower than a thermal conductivity of the first electrode layer 20. In other words, the thermal conductivity of the first electrode layer 20 is higher than the thermal conductivity of the second electrode layer 21. For example, the thermal conductivity of the first electrode layer 20 is about 10 to 80 times the thermal conductivity of the second electrode layer 21.

The first plating layer 22 is disposed to cover the second electrode layer 21. The first plating layer 22 is formed on five surfaces of one end surface 2a, the pair of main surfaces 2c and 2d, and the pair of side surfaces 2e and 2f. That is, an edge of the first plating layer 22 is disposed on the thin film layer 10. The first plating layer 22 is a Ni plating layer formed by Ni plating.

The second plating layer 23 is disposed to cover the first plating layer 22. The second plating layer 23 is formed on five surfaces of one end surface 2a, the pair of main surfaces 2c and 2d, and the pair of side surfaces 2e and 2f. That is, an edge of the second plating layer 23 is disposed on the thin film layer 10. The second plating layer 23 is a Sn plating layer formed by Sn plating.

As shown in FIG. 1, the second external electrode 4 is disposed on the side of the other end surface 2b. The second external electrode 4 is formed on five surfaces of one end surface 2b, the pair of main surfaces 2c and 2d, and the pair of side surfaces 2e and 2f. The second internal electrode 6 is directly connected to the second external electrode 4.

The second external electrode 4 includes a first electrode layer 30, a second electrode layer 31, a first plating layer 32, and a second plating layer 33.

The first electrode layer 30 is disposed on one end surface 2b of the element body 2. The first electrode layer 30 is electrically connected to the second internal electrode 6. The first electrode layer 30 is formed of the same material as the first electrode layer 20.

The second electrode layer 31 is disposed to cover the first electrode layer 30. The second electrode layer 31 is formed on five surfaces of one end surface 2b, the pair of main surfaces 2c and 2d, and the pair of side surfaces 2e and 2f. The second electrode layer 31 is formed of the same material as the second electrode layer 21.

The first plating layer 32 is disposed to cover the second electrode layer 31. The first plating layer 32 is formed on five surfaces of one end surface 2b, the pair of main surfaces 2c and 2d, and the pair of side surfaces 2e and 2f. The first plating layer 32 is formed of the same material as the first plating layer 22.

The second plating layer 33 is disposed to cover the first plating layer 32. The second plating layer 33 is formed on five surfaces of one end surface 2b, the pair of main surfaces 2c and 2d, and the pair of side surfaces 2e and 2f. The second plating layer 33 is formed of the same material as the second plating layer 23.

As described above, in the NTC thermistor 1 according to the embodiment, the second electrode layer 21 (the second electrode layer 31) of the first external electrode 3 (the second external electrode 4) is disposed to cover the first electrode layer 20 (the first electrode layer 30). A thermal conductivity of the second electrode layer 21 (the second electrode layer 31) is lower than a thermal conductivity of the first electrode layer 20 (the first electrode layer 30). Therefore, when the NTC thermistor 1 is mounted on a circuit board or the like, heat generated in the circuit board or the like can be suppressed from being transferred to the element body 2. Also, the outer surface of the element body 2 is covered with the thin film layer 10. Thus, in the NTC thermistor 1, the heat generated in the circuit board or the like can be suppressed from being transferred to the element body 2. Accordingly, the NTC thermistor 1 can minimize deterioration of characteristics due to the heat generated in the circuit board or the like. As a result, in the NTC thermistor 1, it is possible to minimize deterioration in reliability. Therefore, the NTC thermistor 1 can accurately detect an ambient temperature without being affected by the heat of the circuit board or the like.

In the NTC thermistor 1 according to the embodiment, the thin film layer 10 is formed along the respective surface shapes of the pair of end surfaces 2a and 2b, the pair of main surfaces 2c and 2d, and the pair of side surfaces 2e and 2f. The outer surface of the element body 2 may be concavo-convex. Therefore, a surface area of the thin film layer 10 can increase and an anchoring effect can be obtained by forming the thin film layer 10 along the surface shape of the outer surface of the element body 2. Therefore, adhesion between the thin film layer 10 and the first electrode layer 20 and the second electrode layer 21 (the first electrode layer 30 and the second electrode layer 31) can be improved. Thus, since the NTC thermistor 1 can secure bonding strength between the thin film layer 10 and the first electrode layer 20 and the second electrode layer 21 (the first electrode layer 30 and the second electrode layer 31), separation of the first electrode layer 20 and the second electrode layer 21 (the first electrode layer 30 and the second electrode layer 31) can be minimized. As a result, in the NTC thermistor 1, it is possible to minimize deterioration in reliability.

In the NTC thermistor 1 according to the embodiment, the thickness T2 of the thin film layer 10 disposed on the pair of main surfaces 2c and 2d and the pair of side surfaces 2e and 2f is larger than the thickness T1 of the thin film layer 10 disposed on the pair of end surfaces 2a and 2b. In this configuration, since the thickness of the thin film layer 10 disposed on the pair of main surfaces 2c and 2d and the pair of side surfaces 2e and 2f is large, it is possible to prevent heat from being transferred from the pair of main surfaces 2c and 2d and the pair of side surfaces 2e and 2f into the element body 2. Further, since the thickness of the thin film layer 10 disposed on the pair of end surfaces 2a and 2b is relatively small (thin), the first internal electrode 5 withdrawn to the end surfaces 2a and 2b and the second internal electrode 6 withdrawn to the end surface 2b breaks through the thin film layer 10 and are exposed from the thin film layer 10. Therefore, electrical connection between the first external electrode 3 and the second external electrode 4 and the first internal electrode 5 and the second internal electrode 6 can be ensured.

In the NTC thermistor 1 according to the embodiment, the thin film layer 10 is formed of amorphous glass. For example, when the thin film layer 10 is formed of crystallized glass, it is difficult to form the thin film layer 10 along the surface shape of the outer surface of the element body 2, and the surface of the thin film layer 10 may be smooth (flat). In this case, the adhesion between the thin film layer 10 and the first electrode layer 20 and the second electrode layer 21 (the first electrode layer 30 and the second electrode layer 31) cannot be ensured. On the other hand, when the thin film layer 10 is formed of amorphous glass, it is possible to form the thin film layer 10 along the surface shape of the outer surface of the element body 2. Thus, in the NTC thermistor 1, the surface area of the thin film layer 10 can increase and an anchoring effect can be obtained. Therefore, in the NTC thermistor 1, the adhesion between the thin film layer 10 and the first electrode layer 20 and the second electrode layer 21 (the first electrode layer 30 and the second electrode layer 31) can be improved.

The element body 2 is formed of a semiconductor ceramic. Therefore, when the first plating layer 22 and the second plating layer 23 of the first external electrode 3 and the first plating layer 32 and the second plating layer 33 of the second external electrode 4 are formed, the plating may extend from the element body 2 and the plating may be formed at an undesired place on the element body 2. In the NTC thermistor 1 according to the embodiment, the thin film layer 10 is formed on the outer surface of the element body 2. Therefore, formation of a plating layer at an undesired place on the element body 2 can be avoided.

Although the embodiment of the present invention have been described above, the present invention is not necessarily limited to the above-described embodiment, and various modifications are possible without departing from the gist thereof.

In the above-described embodiment, an example in which the electronic component is the NTC thermistor 1 has been described. However, the electronic component may be a varistor, a PTC thermistor or the like. When the electronic component is a varistor, the semiconductor ceramic contains, for example, ZnO (zinc oxide) as a main component, and metal elements such as Co, rare earth metal elements, Group IIIb elements (B, Al, Ga, In), Si, Cr, Mo, alkali metal elements (K, Rb, Cs), alkaline earth metal elements (Mg, Ca, Sr, Ba), or the like, and oxides thereof may be contained as accessory components.

In the above-described embodiment, an example in which three first internal electrodes 5 and three second internal electrodes 6 are disposed has been described. However, the number of internal electrodes (internal conductors) may be appropriately set according to the design.

The shapes of the first external electrode 3 and the second external electrode 4 may be appropriately set according to the design.

What is claimed is:

1. An electronic component comprising:
    an element body having a pair of end surfaces which face each other and four side surfaces which connect the pair of end surfaces and formed of a semiconductor ceramic;
    a thin film layer disposed to cover the pair of end surfaces and the four side surfaces and having an electrical insulation property;
    a first external electrode and a second external electrode disposed on a side of each of the pair of end surfaces; and
    an internal conductor disposed in the element body,
    wherein the thin film layer is formed along a surface shape of each of the pair of end surfaces and the four side surfaces,
    each of the first external electrode and the second external electrode has a first electrode layer disposed on the thin film layer and electrically connected to the internal conductor, a second electrode layer disposed to cover the first electrode layer, a first plating layer disposed to cover the second electrode layer, and a second plating layer disposed to cover the first plating layer,
    a thermal conductivity of the second electrode layer is lower than a thermal conductivity of the first electrode layer; and
    a thermal conductivity of the first plating layer and the second plating layer is lower than the thermal conductivity of the first electrode layer.

2. The electronic component according to claim 1, wherein a thickness of the thin film layer disposed on the four side surfaces is greater than a thickness of the thin film layer disposed on the pair of end surfaces.

3. The electronic component according to claim 1, wherein the thin film layer has a thickness of 50 nm or more and 300 nm or less.

\* \* \* \* \*